United States Patent
Shi

(10) Patent No.: US 7,060,131 B2
(45) Date of Patent: Jun. 13, 2006

(54) EPITAXY WITH COMPLIANT LAYERS OF GROUP-V SPECIES

(75) Inventor: Binqiang Shi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 717 days.

(21) Appl. No.: 09/851,839

(22) Filed: May 9, 2001

(65) Prior Publication Data
US 2002/0166501 A1    Nov. 14, 2002

(51) Int. Cl.
*C30B 23/02* (2006.01)
(52) U.S. Cl. .................. 117/84; 117/103; 117/106; 117/108; 117/97; 117/94; 117/92
(58) Field of Classification Search .............. 117/84, 117/90, 92, 94, 97, 103, 106, 108
See application file for complete search history.

(56) References Cited

U.S. PATENT DOCUMENTS

| | | | |
|---|---|---|---|
| 3,941,624 A * | 3/1976 | Cho ................... | 117/105 |
| 4,330,360 A * | 5/1982 | Kubiak et al. ........... | 117/108 |
| 4,470,192 A * | 9/1984 | Miller .................. | 117/106 |
| 4,575,462 A * | 3/1986 | Dobson et al. .......... | 117/105 |
| 4,645,689 A * | 2/1987 | Cox .................... | 117/91 |
| 4,824,518 A * | 4/1989 | Hayakawa et al. ........ | 117/106 |
| 4,876,218 A * | 10/1989 | Pessa et al. ........... | 117/105 |
| 4,897,367 A * | 1/1990 | Ogasawara ............. | 117/108 |
| 5,094,974 A * | 3/1992 | Grunthaner et al. ...... | 117/105 |
| 5,221,367 A * | 6/1993 | Chisholm et al. ........ | 117/105 |
| 5,294,287 A * | 3/1994 | Chang et al. ........... | 117/108 |
| 5,432,124 A * | 7/1995 | Nishikata et al. ....... | 117/106 |
| 5,538,702 A * | 7/1996 | Smith et al. ........... | 423/210 |
| 5,656,540 A * | 8/1997 | Nomura et al. ......... | 117/104 |

* cited by examiner

*Primary Examiner*—Robert Kunemund
*Assistant Examiner*—Matt Song
(74) *Attorney, Agent, or Firm*—Ladas & Parry LLP

(57) ABSTRACT

The present invention relates a method for epitaxial growth of a second group III-V crystal having a second lattice constant over a first group III-V crystal having a first lattice constant, wherein strain relaxation associated with lattice-mismatched epitaxy is suppressed and thus dislocation defects do not form. In the first step, the surface of the first group III-V crystal (substrate) is cleansed by desorption of surface oxides. In the second step, a layer of condensed group-V species is condensed on the surface of the first group III-V crystal. In the third step, a mono-layer of constituent group-III atoms is deposited over the layer of condensed group-V species in order for the layer of constituent group-III atoms to retain the condensed group-V layer. Subsequently, the mono-layer of group-III atoms is annealed at a higher temperature. In the fourth step, bulk of the second group III-V crystal is grown with the condensed group-V layer accommodating the strain build-up which occurs during the bulk growth.

34 Claims, 6 Drawing Sheets

EPITAXY WITH COMPLIANT LAYERS OF GROUP-V SPECIES

TECHNICAL FIELD

This invention relates to the field of semiconductor materials, and in particular, to the growth of semiconductor crystals.

BACKGROUND OF THE INVENTION

An obstacle in realizing next generation microelectronic and optoelectronic devices and optimal integration of these devices is found in lattice mismatches between different crystals of group III-V semiconductor materials. Generally, the lattice mismatch between a substrate and an epitaxial over-layer induces strains within the over-layer. This may lead to strain relaxation which can result in formation of material defects such as dislocations within the crystalline structure of the over-layer. FIG. 1 illustrates a mismatched over-layer 1 epitaxially grown over a substrate 2, the boundary between the over-layer 1 and the substrate 2 being indicated with reference numeral 4. As shown in FIG. 1, the lattice constant associated with the over-layer 1 is different from the lattice constant associated with the substrate 2, hence the term "mismatched over-layer". Strain relaxation due to lattice mismatch is accommodated by the formation of mismatch dislocations 3 within the crystal. Defects within a crystal generally degrade the performance of devices made from the crystal, because such defects can scatter movement of carriers (electrons and holes) and can act as carrier traps and/or recombination centers. It is thus useful to provide means for growing a crystal over-layer which has different lattice constant from the substrate on which the over-layer is grown, in such a fashion that strain relaxation does not occur and mismatch dislocations do not form. FIG. 2 is an example of a schematic representation of how lattice mismatch is taken by a condensed layer of group-V species, in which the structure of over-layer 1 is preserved and no mismatch dislocations are formed.

In the prior art, two main approaches are used to address the lattice mismatch problem and the strain relaxation it causes 1) In a first approach, defects are confined in thick relaxed buffers so that the top active layer of a device can be of a different lattice constant from that of the substrate and is as defect free as possible.

2) In a second approach, thin compliant solid layers are bonded to foreign substrates and re-growth is performed.

However, these approaches still present performance degradation problems. A buffer layer of defects degrades the quality of the active layer on top of the buffer layer used for a device. In addition, thick buffer layers are not very suitable for device fabrication because high mesa or deep isolation implants are then necessary for device isolation, and can result in high leakage currents and low wafer yields. Further, procedures for implementing the second approach are rather complicated due to problems associated with wafer bonding, fabrication of thin layers (tens of Å in thickness) and re-growth on surfaces contaminated in the wafer-bonding and fabrication processes.

Hence, there is a need for a method of growing a crystal over a substrate such that mismatch dislocations are prevented from appearing within the crystal, even though the crystal and the substrate have different lattice constants.

BRIEF DESCRIPTION OF THE INVENTION

In accordance with this invention, compliant layers of group-V species are formed in situ, which distinguishes this invention from the prior art. Indeed, in this invention, formation of compliant layers does not require wafer-bonding and fabrication procedures performed outside of the growth chamber. Furthermore, crystals grown on top of compliant layers will not be strained and therefore, will not suffer strain relaxation which results in dislocation defects.

The present invention relates to processes and methods which facilitate the epitaxial growth of group III-V crystals of different lattice constants on top of each other. One object of this invention is to suppress strain relaxation associated with lattice-mismatched epitaxy. This is realized with a growth process that initially forms a substrate surface free of oxides. The growth process then deposits, at appropriately low growth temperatures, a layer of condensed group-V species and a mono-layer of constituent group-III atoms in order for the crystal over-layer to retain the condensed layer. Subsequently, the mono-layer is annealed at a higher temperature. Finally, the bulk of the crystal over-layer is grown with the condensed group-V layer accommodating the strain build-up which occurs during the bulk growth.

In one example of the lattice-mismatch growth process, the substrate may be gallium arsenide, the condensed group-V species may be arsenic and the crystal over-layer to be grown may be indium arsenide (The lattice constant of indium arsenide differs from that of gallium arsenide by 7.2%).

In one aspect, the present invention relates to a semiconductor device comprising a substrate of a group-III/group-V material, a layer of a group-V material disposed over the substrate, a mono-layer of group-III atoms disposed over the layer of group-V material, and a layer of a group-III/group-V crystal epitaxially grown over the mono-layer.

DETAILED DESCRIPTION OF THE INVENTION

In accordance with this invention, the process or method of growing of a group III-V crystal on top of another group III-V crystal (substrate), without introducing lattice-mismatch defects, include the following steps:

Step 1: Thermal Desorption Cleansing of the Substrate

In a preferred embodiment, the material forming the substrate upon which the epitaxial over-layer is to be grown may include GaAs, GaP, InAs or InP. As would be apparent to the skilled person, other group III-V compounds or crystals may be used as well.

Figure 3:
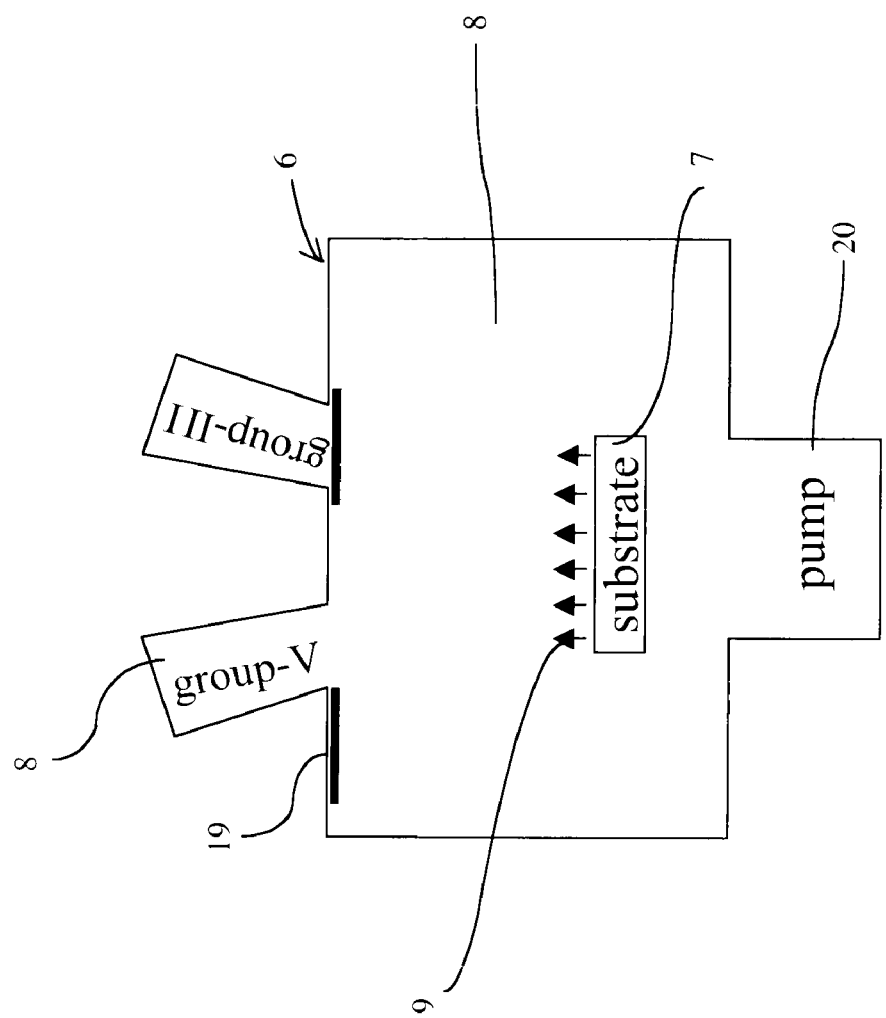
FIG. 3 is a schematic representation of the growth chamber illustrating desorption of surface oxides from the surface of the substrate.

In this step, and as illustrated by FIG. 3, the substrate 7 is first heated inside a growth chamber 6, to a temperature $T_s$, where $T_s$ ranges from about 495° C. to about 600° C. Vapor 8 comprising group-V species (e.g., $As_2$, $As_4$, $P_2$, $P_4$ or other group-V members) is introduced in the growth chamber 6 when the substrate 7 is heated. The pressure P of the vapor 8 introduced may range from about 0.004 pa to about 0.012 pa, which pressure P is larger than the vapor pressure $P_s$ of the substrate 7 at temperature $T_s$. The temperature of the vapor 8 which is introduced in the growth chamber 6, may range from about 300° C. to about 1000° C. The substrate 7 is then annealed under this over-pressure of group-V species vapor, at temperature $T_s$, and desorption of surface oxides 9 from the substrate 7 takes place, with the surface oxides being removed from the chamber by pump 20.

Step 2: In situ Introduction of Condensed Group-V Species

Figure 2:
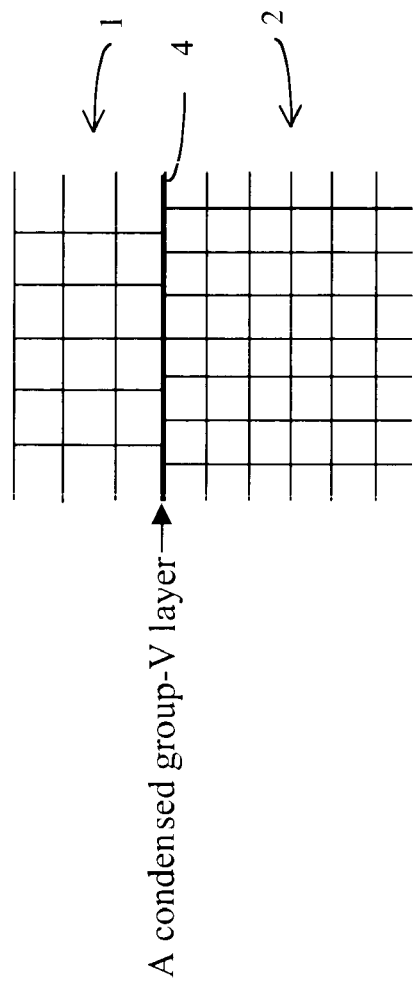
FIG. 2 is a schematic representation of how lattice mismatch is accommodated by a condensed layer of group-V species in accordance with this invention.
Figure 1:
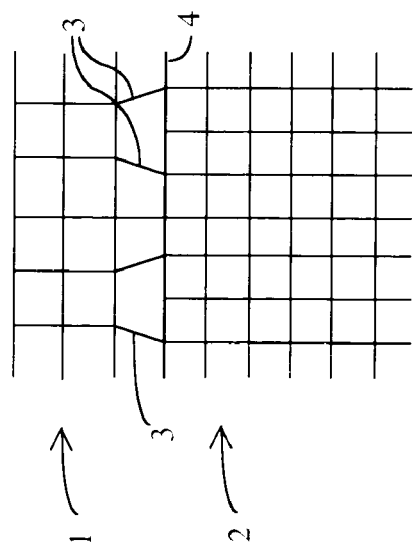
FIG. 1 is a schematic representation of a mismatched layer where some of the strain has relaxed by the formation of mismatched dislocations within the grown upper layer.
Figure 4:
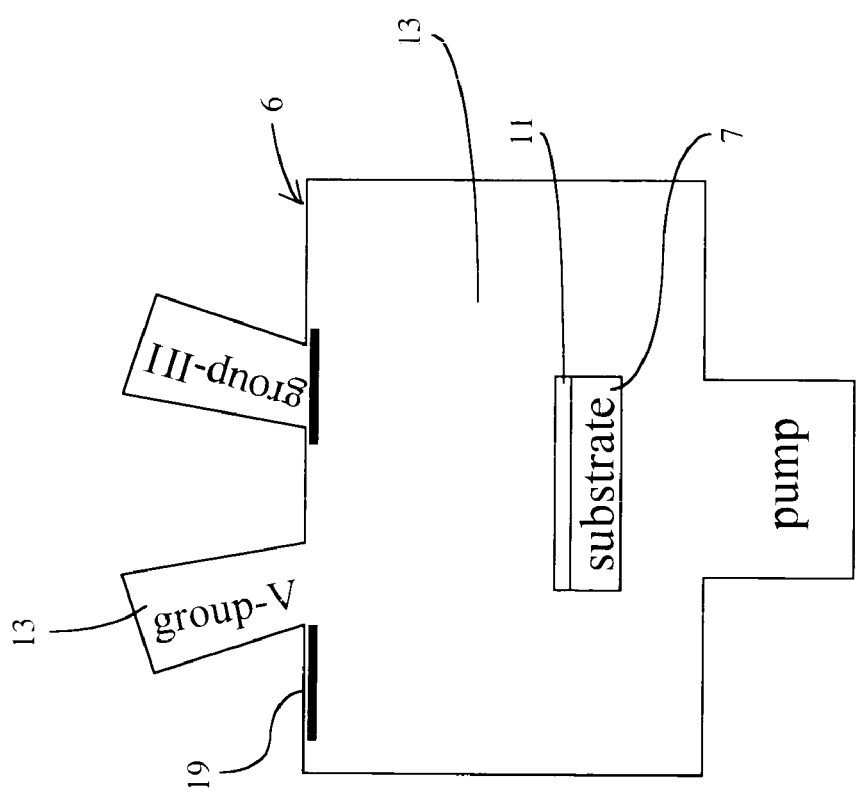
FIG. 4 is a schematic representation of the growth chamber illustrating the deposit of a first layer of group-V species over the substrate.

As sown in FIG. 4, an ultra-thin layer 11 of condensed group-V species (layer 4 of FIG. 1) which, in a preferred embodiment may comprise $As_2$, $As_4$, $P_2$ or $P_4$, is then introduced in situ at a temperature $T_c$, which temperature is lower than the optimal growth temperature for epitaxy of the crystal which is to be grown. Temperature $T_c$ may vary from about 30° C. to about 250° C. In this step, and as illustrated by FIG. 4, a vapor 13 comprising a group-V species is introduced onto the surface of the substrate 7 by opening shutter 19. When the temperature $T_s$ of the substrate 7 is appropriately low (between about 30° C. and about 250° C.), and the pressure $P_c$ of the group-V vapor 13 is adequate (about 0.004 pa to about 0.012 pa), condensation of the group-V species on the substrate 7 takes place. The thickness of the layer 11 of group-V species which condenses on the surface of the substrate 7, can be controlled by varying the temperature $T_s$ of the substrate 7. Indeed, the amount of desorption from the condensed layer of group-V species is dependent on the temperature. In other words, different thicknesses of the layer 11 can be achieved by varying the temperature $T_s$. The temperature $T_s$ of the substrate 7 is preferably set such that the thickness of the layer of the group-V species falls into a range of several Å to a few tens of Å. The desired thickness of the layer 11 is achieved as soon as the temperature $T_s$ is reached, generally in a matter of seconds.

Step 3: Deposit of a Mono-Layer of Group-III Atoms on the Group-V Layer

Figure 5:
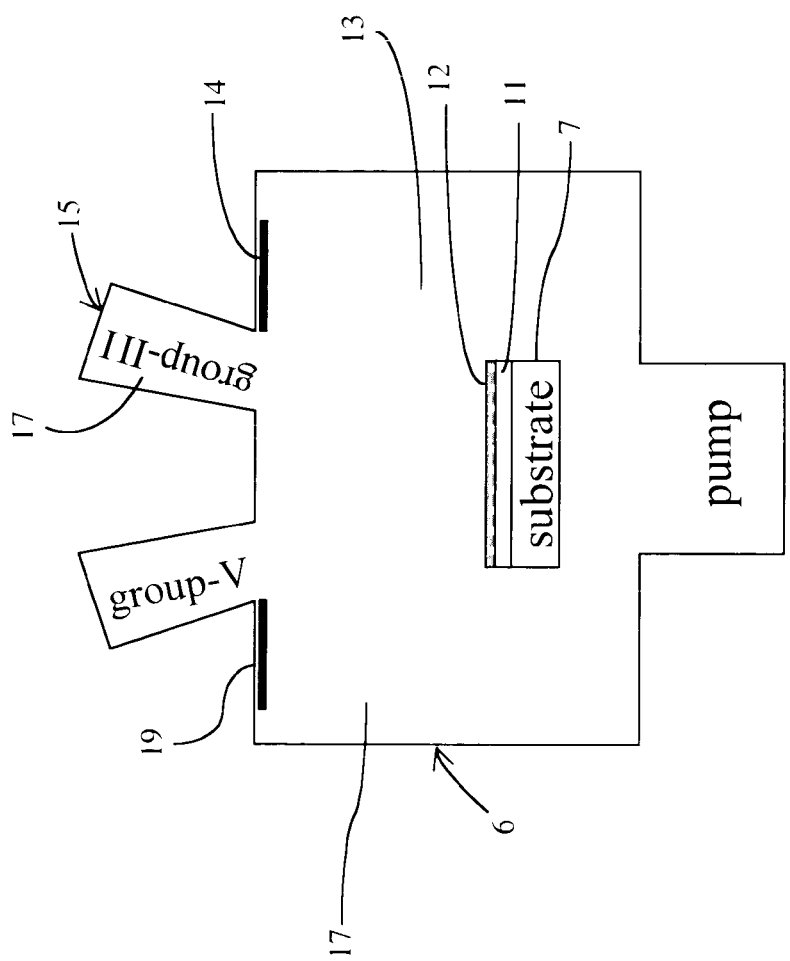
FIG. 5 is a schematic representation of the growth chamber illustrating the deposit of a second layer of group-III species over the first layer of group-V species.

A layer of group-III atoms 12 is then deposited over the group-V layer 11 previously deposited on the substrate 7, as illustrated by FIG. 5. This layer 12 may be have a thickness ranging from one atom to a few atoms. In the preferred embodiment, the layer 12 is a mono-layer of group-III atoms. The layer of group-III atoms 12 may comprise In, Ga, Al or any combination of Ga, Al and In. The deposit may be made by opening, for an appropriate duration of time (between about 1 second and about 3 seconds) the shutter 14 of the furnace 15 containing a vapor of group-III atoms 17. This duration of time may vary according to the geometry of the shutter 14 and furnace 15, and the evaporation rate of the group-III atoms introduced. The vapor of group-III atoms is introduced at a temperature ranging from about 780° C. to about 1250° C. and at a pressure of about $5 \times 10^{-5}$ pa. In atoms are preferably introduced at a temperature of about 780° C., Ga atoms are preferably introduced at a temperature of about 900° C., and Al atoms are preferably introduced at a temperature of about 1200° C.

After introduction of the vapor of group-III atoms 17 in the growth chamber 6, the vapor of group-III atoms 17 condenses on the surface of the substrate 7 above the layer of group-V atoms 11, forming a mono-layer of group-III atoms 12. At this stage the substrate 7 is kept at a temperature $T_d$ ranging from about 30° C. to about 250° C. and the pressure of the group-V vapor 13 which was introduced in step 2 is maintained around 0.008 pa. The mono-layer of group-III atoms 12, is then annealed by raising the temperature of the substrate $T_d$ to a temperature from about 400° C. to about 580° C., under a pressure of group-V vapor 13 of about 0.008 pa. Such mono-layer of group-III atoms 12 has the property of changing the desorption tendency of the group-V species layer 11 lying underneath, and allows retention of the group-V species layer 11 during the annealing phase, which precedes the actual epitaxial growth of the crystal at an optimal growth temperature. The group-III atoms in the mono-layer 12 will seek lattice sites of a lower free energy during annealing, and will therefore form a propitious starting atomic plane for subsequent epitaxial growth. Because the bonding, between group-V molecules in the thin condensed layer 11 initially deposited, is much weaker than that between atoms of the solid crystal to be grown, the group-V molecules will relocate during the subsequent epitaxy to accommodate the lattice mismatch between the solid substrate crystal 7 and the desired solid crystal over-layer.

Step 4: Epitaxial Growth of Crystal

Figure 6:
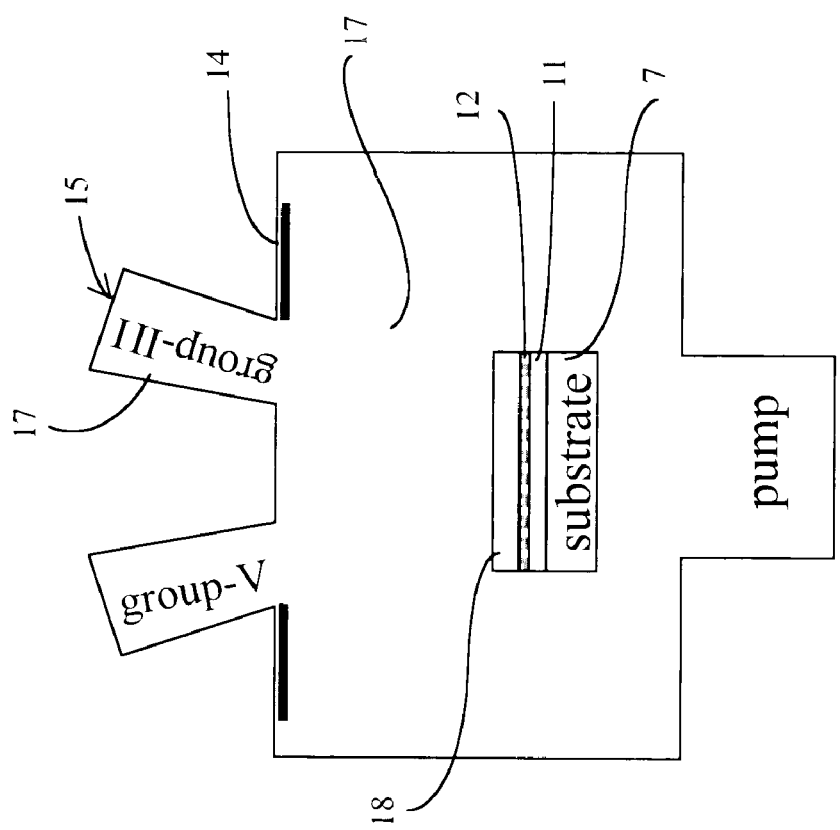
FIG. 6 is a schematic representation of the growth chamber illustrating the epitaxial growth of a crystal over the second layer.

Growth of bulk group III-V species layer 18 may then be initiated by opening again the shutter 14 of the group-III furnace 15 as illustrated by FIG. 6. Such group III-V species layer 18 may include InAs, $In_x Ga_{1-x}As$, $In_x Al_{1-x}As$ or GaP, but other group III-V species may be contemplated as well. In a preferred embodiment, group-V species and group-III species are introduced in the growth chamber with the ratio of the group-V flux to the group-III flux being maintained in the range of about 1.5 to about 3.

For the purpose of illustration, the method of growing a group III-V crystal on top of another group III-V crystal, without introducing lattice-mismatch defects, is described in the particular example where the substrate is GaAs, the thin-layer of group-V species is $As_2$, the mono-layer of group-III atoms is indium, and the crystal epitaxially grown is InAs. This method comprises the following steps:

Step 1: Thermal Desorption Cleaning of the Substrate

In one embodiment of this invention, a GaAs substrate 7 is heated to about 600° C. and annealed for about 10 minutes under an $As_2$ vapor 8 at a pressure of about 0.008 pa, which pressure is larger than the vapor pressure of GaAs at 600° C.

Step 2: In Situ Introduction of Condensed Group-V Species

In this step, the temperature of the substrate 7 is first allowed to drop or is cooled to about 110° C. while the substrate 7 is subjected to an $As_2$ vapor pressure 13 of about 0.008 pa, so that a condensed layer 11 of $As_2$ is formed on the surface of the substrate 7. The $As_2$ condensed layer 11 is then thinned down to the desired thickness, which thickness is preferably around several tens of Å or less, by then raising the temperature of the substrate 7 to about 250° C.

Step 3: Deposit of a Mono-Layer of Group-III Atoms on the Group-V Layer

In this exemplary embodiment, the desired number of group-III atoms per surface area forming the mono-layer is approximately 6.5e14 $cm^{-2}$. The shutter 14 of the furnace 15 is opened to introduce indium vapor 17 at 790° C. so that a mono-layer of indium 12 is deposited over the condensed $As_2$ layer 11. When the group-III flux incident on the growth surface is about 6.5e14/2.2 $cm^{-2}s^{-1}$, the shutter is preferably opened for 2.2 seconds in order to obtain the desired mono-layer of 6.5e14 $cm^{-2}$ group-III atoms. The substrate temperature is kept at about 250° C. while still being subjected to a pressure of $As_2$ vapor 13 of about 0.008 pa. The temperature of the substrate 7 is then raised to about 400° C. while the $As_2$ pressure 13 inside the growth chamber is maintained around 0.008 pa. The mono-layer of indium 12 is annealed when the substrate temperature ramps from about 250° C. to about 400° C. After this step, the conditions are propitious for epitaxial growth of InAs, without introducing dislocation defects due to lattice mismatch between the GaAs substrate and the InAs crystal.

Step 4: Epitaxial Growth of Crystal

Growth of bulk InAs layer 18 may then be initiated by reopening the shutter 14 of the indium furnace 15. The temperature is maintained at the optimal epitaxial growth temperature for InAs, between about 400° C. and about 450° C., while the ratio of the group-V flux to the group-III flux introduced, is preferably maintained around 2.5.

In the methods described above, the substrate 7 may be heated in any way known in the art, including through contact heat diffusion or radiation heat transfer. In one embodiment, a tantalum filament is heated up by inducing an electrical current through the filament. The filament is preferably disposed adjacent the back of the substrate, such that the heated filament radiates energy to the substrate. Heat shields may be disposed under both the substrate and the filament in such a way that most of the heat radiated by the filament is efficiently transmitted to the substrate.

A pump 20 may be used throughout the steps of the methods of the present invention in order to rid the growth chamber of unwanted residual vapors, including surface oxides.

Figure 7:
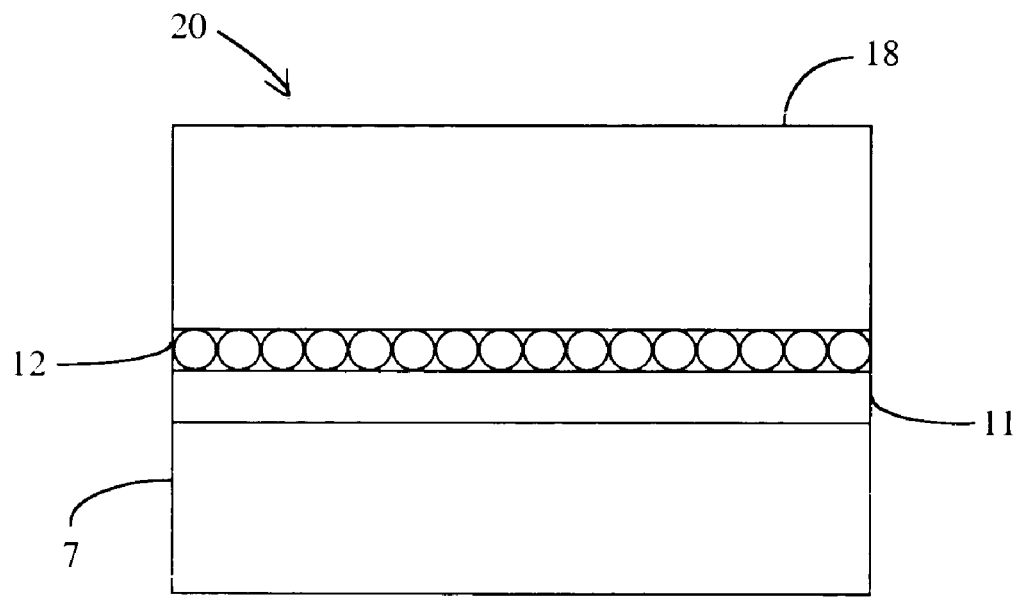
FIG. 7 is a schematic representation of a semiconductor device in accordance with this invention.
Figure 8:
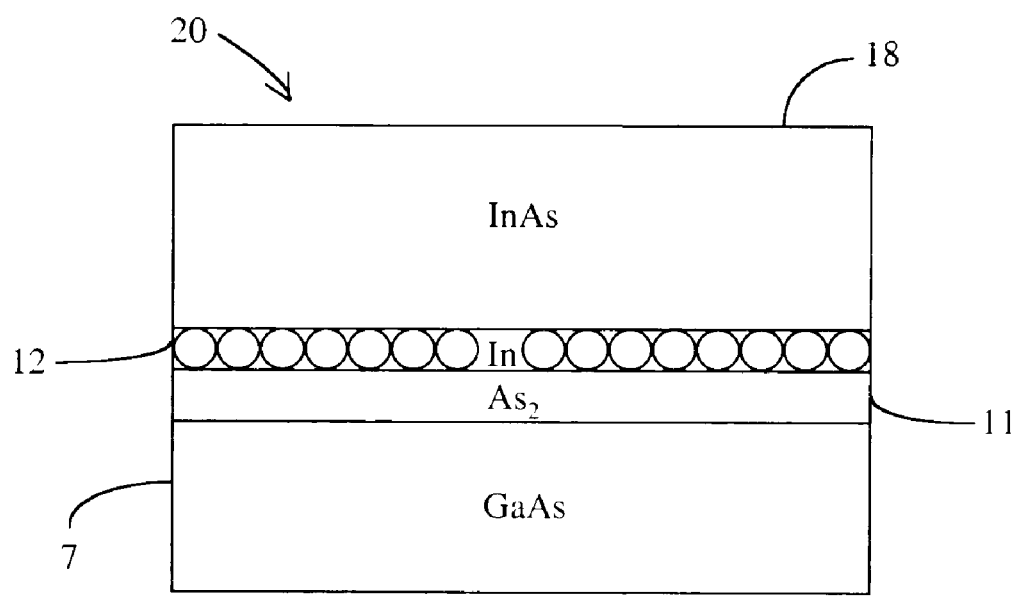
FIG. 8 is a schematic representation illustrating an exemplary embodiment of a semiconductor device in accordance with this invention.

In another aspect, the present invention relates to a semiconductor device as shown in FIG. 7. The semiconductor 20 comprises a substrate 7 of a group-III/group-V material, a layer 11 of group-V material disposed over the substrate 7, a mono-layer 12 of group-III atoms disposed over the layer 11, and a layer 18 of epitaxially grown group-III/group-V crystal disposed over the mono-layer 12. In an exemplary embodiment of the semiconductor device 20 shown in FIG. 8, the substrate 7 is GaAs, the layer 11 is $As_2$, the mono-layer 12 is In, and the crystal 18 is InAs.

Even though the present invention is described in connection with specific group-II and group-V elements, any combination of these elements may be used.

Having described the invention in connection with certain embodiments thereof, modifications will certainly suggest themselves to those skilled in the art. As such, the invention is not to be limited to the disclosed embodiments except as required by the appended claims.

The invention claimed is:

1. A method of epitaxially growing a second crystal over a first crystal, the first crystal having a first lattice constant, the second crystal having a second lattice constant, the method comprising the steps of:
   a) cleansing a surface of the first crystal by thermal desorption;
   b) depositing a first layer of a first material over the surface of the first crystal;
   c) depositing a second layer of a second material over the first layer; and
   d) epitaxially growing the second crystal over the second layer;

wherein the first layer substantially accommodates strain accumulated between the first crystal and the second crystal during epitaxial growth, thereby substantially preventing strain relaxation and formation of dislocation defects.

2. The method of claim 1, wherein the step a) of cleansing the surface of the first crystal by thermal desorption includes the steps of:
   a1) bringing a temperature of the first crystal to Ts° C., Ts ranging from about 495° C. to about 600° C.;
   a2) introducing a vapor having a vapor pressure; and
   a3) annealing the first crystal tinder the vapor pressure at temperature Ts;

wherein the vapor pressure is greater than a vapor pressure of the first crystal at temperature Ts.

3. The method of claim 2, wherein the vapor pressure ranges from about 0.004 pa to about 0.012 pa, and wherein surface oxides of the first crystal are desorbed.

4. The method of claim 3, wherein the first crystal comprises group-III/group-V species, and the vapor comprises group-V species.

5. The method of claim 4, wherein the first crystal comprises GaAs, GaP, InAs or InP, and wherein the vapor comprises $As_2$ or $As_4$ if the first crystal is GaAs or InAs, or the vapor comprises InAs, $P_2$ or $P_4$ if the first crystal is GaP or InP.

6. The method of claim 2, wherein the step b) of depositing a first layer includes the steps of:
   b1) introducing a first vapor of the first material, wherein part of the first vapor condenses on the surface of the first crystal, thereby forming the first layer; and
   b2) adjusting a thickness of the first layer by varying a temperature of the first crystal.

7. The method of claim 6, wherein the first vapor is introduced at a temperature which is less than an optimal growth temperature for epitaxy.

8. The method of claim 7, wherein the first crystal comprises group-III/group-V species, and the first material comprises group-V species.

9. The method of claim 8, wherein the first crystal comprises GaAS, GaP, InAs or InP, and the first material comprises $As_2$, $As_4$, $P_2$ or $P_4$.

10. The method of claim 9, wherein the thickness of the first layer ranges from approximately a few Å to approximately a few tens of Å.

11. The method of claim 10, wherein the step b1) of introducing a first vapor of the first material, includes the step of opening a first shutter blocking a growth chamber from a first vapor source.

12. The method of claim 6, wherein the step c) of depositing a second layer includes the steps of:
   c1) introducing the second vapor, a temperature of the first crystal being maintained at Td within a range of about 30° C. to about 250° C., wherein at least part of the second vapor condenses over the first layer;

c2) annealing the second layer by raising the temperature of the first crystal from Td to a temperature of about 400° C. to about 580° C., under a pressure of the first vapor of about 0.008 pa.

13. The method of claim 12, wherein an amount of the second vapor introduced is such that the second layer is formed by a mono-layer of atoms of the second material.

14. The method of claim 13, wherein the step c1) of introducing the second vapor comprises the steps of:

c11) providing a furnace containing a second vapor of the second material;

c12) opening a second shutter allowing the second vapor to travel from the furnace to a growth chamber;

wherein the second shutter is opened for a predetermined time duration, whereby to allow a predetermined amount of the second vapor to travel from the furnace to the growth chamber, the predetermined amount of the second vapor being determined by the number of atoms of the second material necessary to form a mono-layer of said atoms over first layer.

15. The method of claim 14, wherein the first crystal comprises group-III/group-V species, the first material comprises group-V species, and the second material comprises group III species.

16. The method of claim 15, wherein the first crystal is selected from the group consisting of GaAS, GaP, InAs and InP, the first material is selected from the group consisting of $As_2$, $As_4$, $P_2$ and $P_4$, the second material is selected from the group consisting of In, Ga and Al or any combination thereof, and wherein the second vapor has a pressure of about 510-5 pa, the second vapor has a temperature of about 780° C. if the second material is In, the second vapor has a temperature of about 900° C. if the second material is Ga, the second vapor has a temperature of about 1200° C. if the second material is Al.

17. The method of claim 16, wherein for the second material, combinations of Ga, Al, and In, are in a relative ratio substantially equal to the ratio of elements forming the second crystal which is to be epitaxially grown.

18. The method of claim 16, wherein the second shutter is opened for a time duration ranging from about 1 second to about 3 seconds.

19. The method of claim 18, wherein a number per surface area of group-III atoms forming the mono-layer is about 6.5e14 cm−2 and wherein the second shutter is opened for 2.2 seconds.

20. The method of claim 16, wherein the thickness of the first layer ranges from a few Å to a few tens of Å.

21. The method of claim 12, wherein the second crystal is a group-III/group-V crystal and wherein the step d) of epitaxially growing the second crystal includes the steps of:

d1) introducing group-III species into a growth chamber;
d2) introducing group-V species into the growth chamber;
d3) maintaining a temperature inside the growth chamber near an optimal temperature for epitaxial growth of the second crystal.

22. The method of claim 21, wherein the group-V species is introduced by opening a first shutter whereby to let a group-V flux into the growth chamber, and the group-III species is introduced by opening a second shutter whereby to let a group-III flux into the growth chamber.

23. The method of claim 22, wherein the ratio of the group-V flux to the group-III flux is substantially in the range of about 1.5 to about 3.

24. The method of claim 23, wherein the second crystal is selected from the group consisting of InAs, $In_xGa_{1-x}As$, $In_xAl_{1-x}As$ or GaP.

25. The method of claim 1, wherein the method is used to manufacture semiconductor devices.

26. The method of claim 25, wherein the method is used in microelectronic and optoelectronic applications.

27. The method of claim 1, wherein the first crystal comprises the first material of the first layer and the second crystal comprises the second material of the second layer, and wherein the first material is a group-V species and the second material is a group-III species.

28. A method of preparing a substrate for subsequent epitaxial growth of a crystal over the substrate, the method comprising the steps of:

a) cleansing a surface of the substrate by thermal desorption;

b) depositing a first layer of a first material over the surface of the substrate; and c) depositing a second layer of a second material over the first layer, wherein the crystal is deposited over the second layer, wherein the first layer accommodates strain accumulated between the substrate and the crystal during epitaxial growth, thereby preventing strain relaxation and formation of dislocation defects.

29. The method of claim 28 wherein:
the substrate comprises group-III/group-V species;
the crystal comprises group-III/group-V species;
the first material comprises group-V species; and
the second material comprises group-III species.

30. The method of claim 29, wherein the first layer has a thickness within a range of approximately a few Å to a few tens of Å.

31. The method of claim 30, wherein the second layer is a monolayer of group-III atoms.

32. The method of claim 28, wherein the first crystal comprises the first material of the first layer and the crystal comprises the second material of the second layer, and wherein the first material is a group-V species and the second material is a group-III species.

33. A method of preparing a GaAs substrate for subsequent epitaxial growth of a InAs layer over the substrate, the method comprising the steps of:

a) extracting surface oxides from a surface of the substrate by thermal desorption, the thermal desorption including the steps of:

a1) heating the substrate to a temperature of about 600° C.; and a2) annealing the substrate for about 10 minutes under a pressure of $As_2$ vapor of about 0.008 pa;

b) depositing a condensed layer of $As_2$ on the surface of the substrate, depositing a condensed layer including the steps of:

b1) lowering the temperature of the substrate to about 110° C. while subjecting the substrate to an $As_2$ vapor pressure of about 0.008 pa, whereby a condensed layer of $As_2$ is formed on the surface of the substrate; and b2) adjusting the thickness of the condensed layer of $As_2$ by raising the temperature of the substrate to about 250° C., thereby thinning the condensed layer of $As_2$ to several tens of Å; and c) depositing a mono-layer of In atoms over the condensed layer of $As_2$, the depositing a mono-layer comprising the steps of:

c1) introducing In vapor at a temperature of about 790° C., the temperature of the substrate being maintained around 250° C. and being subjected to an $As_2$ vapor pressure of about 0.008 pa; and c2) raising the temperature of the substrate to about 400° C. while the $As_2$ vapor pressure is maintained around 0.008 pa, thereby annealing the mono-layer; wherein upon completion of the step c), conditions are propitious for epitaxial growth of the InAs layer, and wherein the epitaxial growth substantially does not introduce dislocation defects caused by lattice mismatch between the GaAs substrate and the InAs layer.

34. The method of claim 33, further comprising the step d) of epitaxially growing the InAs layer, the step d) including the steps of:

d1) introducing a flux of In vapor;

d2) introducing a flux As vapor; and d3) maintaining the temperature of the substrate between about 400° C. and about 450° C.;

wherein the ratio of the flux of As vapor to the flux of In vapor is maintained at about 2.5.

* * * * *